United States Patent [19]
Min et al.

[11] Patent Number: 5,736,420
[45] Date of Patent: Apr. 7, 1998

[54] PROCESS FOR FABRICATING READ ONLY MEMORIES, WITH PROGRAMMING STEP PERFORMED MIDWAY THROUGH THE FABRICATION PROCESS

[75] Inventors: Heikyung Chun Min, Palo Alto, Calif.; Jeffrey Kent Whitney, Salt Lake City, Utah

[73] Assignee: National Semiconductor Corporation, Santa Clara, Calif.

[21] Appl. No.: 638,688

[22] Filed: Apr. 26, 1996

Related U.S. Application Data

[63] Continuation of Ser. No. 336,554, Nov. 9, 1994, abandoned, which is a continuation of Ser. No. 110,054, Aug. 20, 1993, abandoned.

[51] Int. Cl.$^6$ ............................................. H01L 21/8246
[52] U.S. Cl. ........................... 437/45; 437/12; 437/48; 437/240
[58] Field of Search ............................ 437/12, 45, 48, 437/240, 931; 148/DIG. 133

[56] References Cited

U.S. PATENT DOCUMENTS

| | | | |
|---|---|---|---|
| 3,632,433 | 1/1972 | Tokuyama | 437/203 |
| 4,294,001 | 10/1981 | Kuo . | |
| 4,342,100 | 7/1982 | Kuo . | |
| 4,358,889 | 11/1982 | Dickman et al. . | |
| 4,359,817 | 11/1982 | Dickman et al. . | |
| 4,364,165 | 12/1982 | Dickman et al. . | |
| 4,364,167 | 12/1982 | Dickman et al. . | |
| 4,365,405 | 12/1982 | Dickman et al. . | |
| 4,513,494 | 4/1985 | Batra . | |
| 4,600,933 | 7/1986 | Richman | 357/41 |
| 4,633,572 | 1/1987 | Rusch et al. . | |
| 4,649,629 | 3/1987 | Miller et al. . | |
| 4,828,629 | 5/1989 | Ikeda et al. | 437/12 |
| 4,861,126 | 8/1989 | Dautartas et al. | 385/40 |
| 4,889,820 | 12/1989 | Mori | 437/35 |

FOREIGN PATENT DOCUMENTS

| | | | |
|---|---|---|---|
| 0077182 | 7/1978 | Japan | 437/45 |
| 0154259 | 9/1983 | Japan | 437/45 |
| 0079769 | 5/1985 | Japan | 437/45 |
| 0046967 | 2/1989 | Japan | 437/45 |
| 0169070 | 7/1991 | Japan | 437/52 |

OTHER PUBLICATIONS

Wolf, Silicon Processing for the ULSI Era, vol. 1 Lattice Press, pp. 188–189, 1986.

Ghandhi, "VLSI Fabrication Principles" John Wiley & Sons pp. 424–429, 1983.

Research Disclosure #20214, Feb. 1981, "Late programmed SATO ROM fabrication process.

Research Disclosure #20423, Apr. 1981, "Late programming hexagonal cell ROM with double layer polycrystalline silicon fabrication process.

Research Disclosure #20225, Feb. 1981, "Fabrication process for SATO ROM with adjacent SAG IGFETs".

*Primary Examiner*—Chandra Chaudhari
*Attorney, Agent, or Firm*—Limbach & Limbach L.L.P.

[57] ABSTRACT

A novel process for fabricating semiconductor devices including read only memory transistor cells. The memory cells are programmed to either a logical one or logical zero state by adjusting the dopant levels in their channel regions, with a programming implantation step being selectively performed on those ones of the memory cell transistors which are to be programmed, with the programming implantation step being performed midway through the fabrication process. By performing this programming step midway through the process, certain advantages are obtained regarding improved turn around time from the receipt of a customer's order, and yet the problems of incomplete activation of implanted dopants and ineffective gettering by the use of low dopant concentration gettering layers is avoided.

19 Claims, 5 Drawing Sheets

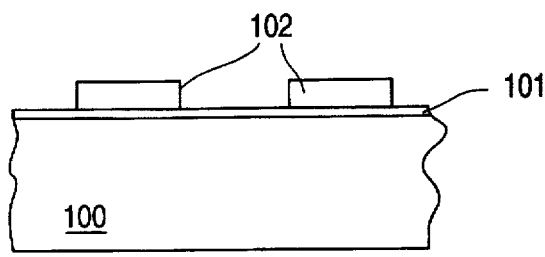
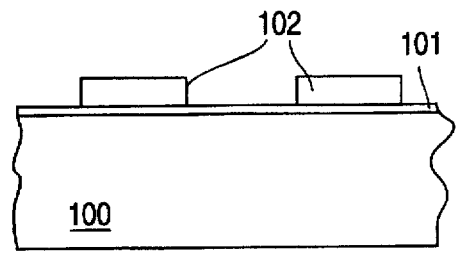
FIG. 2a
(PRIOR ART)
FIG. 4a
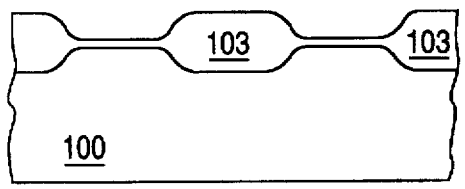
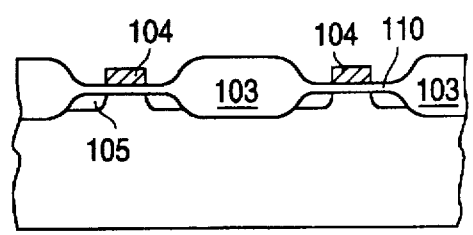
FIG. 2b
(PRIOR ART)
FIG. 4b
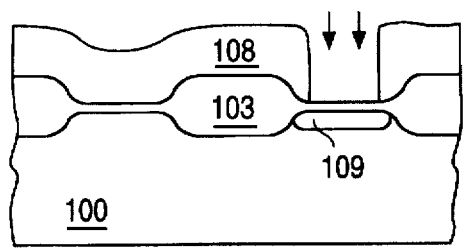
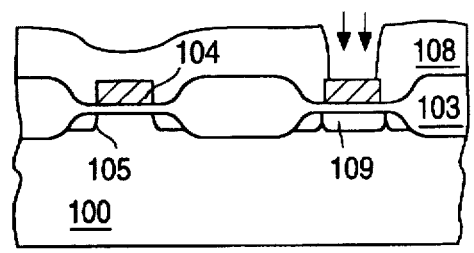
FIG. 2c
(PRIOR ART)
FIG. 4c
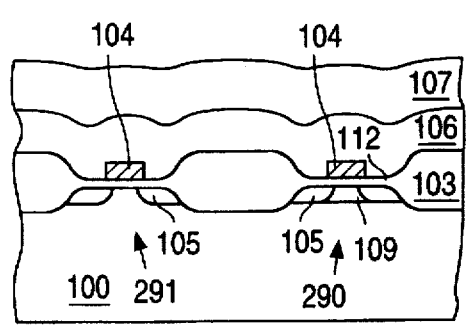
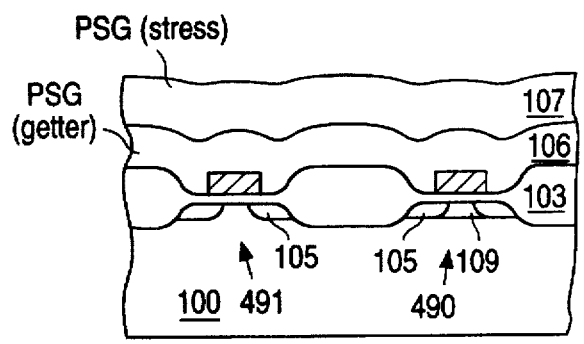
FIG. 2d
(PRIOR ART)
FIG. 4d

PROCESS FOR FABRICATING READ ONLY MEMORIES, WITH PROGRAMMING STEP PERFORMED MIDWAY THROUGH THE FABRICATION PROCESS

This is a continuation of application Ser. No. 08/336,554 filed on Nov. 9, 1994, now abandoned, which is a continuation of Ser. No. 08/110,054, filed Aug. 20, 1993, now abandoned.

BACKGROUND

1. Field of the Invention

This invention pertains to semiconductor memory devices, and more specifically to read only memory devices containing a plurality of cells, wherein each cell is programmed during the manufacturing process to store either a logical 1 or a logical 0. More particularly, this invention pertains to such a read only memory in which programming is performed by implantation after formation of polycrystalline silicon gate electrodes, and before the placement of metal interconnects.

2. Description of the Prior Art

Semiconductor memories are well known in the art, as are semiconductor read only memories (ROMs) which are programmed during the fabrication process. A typical read only memory device includes an array of memory cells, each cell including a memory transistor for storing either a logical 1 or a logical 0. Upon reading a specified address location within the read only memory, the logical state of the data stored in that cell is determined by whether or not the memory cell conducts current when it is addressed. There are a variety of ways to prevent a memory cell and transistor from conducting, or behaving as a normal transistor, during the read operation. For example, its channel may be implanted so that when a normal read voltage is applied to the gate of the memory transistor, the channel is not inverted, and thereby the transistor does not conduct. Alternatively, all transistors can be formed in this way initially, and selected ones of the memory transistors are programmed by implantation to have a threshold voltage sufficient to cause the memory transistor to turn on during the read operation. Other methods of programming read only memories during the fabrication process including techniques such as selectively forming gate electrodes, contact vias, conductive interconnects, and the like, thereby allowing an individual memory cell to be fabricated to have a state of either a logical 1 or a logical 0.

For read only memories in which a very large quantity will be needed, such programming during fabrication can take place at any point in the fabrication process. In this case, such programming is often performed very early in the fabrication process so that, for example, dopants can be diffused in a normal fashion utilizing appropriate annealing and other high temperature process steps. However, in the event that only a relatively small number of read only memories of a particular programming pattern are desired, it is often attempted to produce those ROMs utilizing a fabrication process wherein the programmed state of the memory cells is performed rather late in the fabrication process. This allows a large number of wafers to be processed through the initial steps of the fabrication process and, if desired, held in inventory, with the programming steps taking place late in the fabrication process. This allows fabrication lines to be run at normal throughput levels, assuming that various orders will be received in due course. It also allows inventories of half completed wafers to be built up without regard to the final program desired by various customers.

By providing a fabrication process in which ROM programming is performed late in the fabrication cycle, fabrication costs can be reduced by processing a large number of wafers through the initial fabrication steps with specific programming for specific ROM codes taking place only late in the fabrication process. Also, with the programming of specific ROM codes late in the fabrication process, the turnaround time from receiving a customer's order to providing the customer with finished product is significantly reduced as compared with a ROM fabricated process in which ROM codes are embedded in the ROM device early in the fabrication process.

FIGS. 1a through 1d are a series of cross-sectional views depicting a prior art process for fabricating N channel MOS ROMs wherein a normal transistor is fabricated to program that transistor cell to a logical 0 state, and no transistor is formed at a cell location in which a cell is to be programmed to a logical 1 state. With reference to FIGS. 1a through 1d, the right-hand side of the device shows the fabrication steps for forming a transistor 190 programmed to a logical 0 state by fabricating transistor 190 in a manner in which it is capable of operating as a functional transistor, and the formation of an unprogrammed "transistor" 191 which is programmed to a logical 1 state by utilizing process steps which prevent the formation of a normally functioning transistor 191. In this prior art example, the starting material is a semiconductor substrate 100 of P type material and <100> crystal orientation. As depicted in FIG. 1a, a first process step is to form an initial oxide layer 101 on the active surface of substrate 100. On top of oxide layer 101 is formed nitride layer 102 which is followed by a photoresist mask which is patterned to expose those portions of silicon nitride layer 102 which are to be removed to define where field oxide is to be formed.

As shown in FIG. 1b, following removal of exposed portions of silicon nitride layer 102, field oxide 103 is formed where substrate 100 is not protected by silicon nitride layer 102.

Nitride layer 102 and base oxide layer 101 are then removed and, as shown in FIG. 1c, a gate oxide layer 110 is formed. As shown in FIG. 1d, a layer of polycrystalline silicon is formed over the top surface of the device and doped to a desired conductivity. An additional layer of photoresist (not shown) is formed on the surface of the polycrystalline silicon layer and patterned to expose those portions of the layer of polycrystalline silicon which are to be removed in order to leave only gate electrode 104 and any desired interconnects formed of polycrystalline silicon (not shown).

A source/drain implant is performed to form source/drain region 105 utilizing field oxide 103 and polycrystalline silicon 104 as source/drain implantation masks.

An additional photoresist mask is used in order to remove portions of source/drain oxide layer 112 in locations where a subsequent electrical interconnect layer is to contact one or both source/drain region 105, if desired. Then a layer of phosphosilicate glass (PSG) 106 is formed over the entire surface of the device, typically having a phosphorous concentration of approximately 8%. A getter operation at high temperature is performed to allow PSG layer 106 to serve as a gettering source in order to trap undesired mobile ions such as sodium.

Additional steps are then performed (although for convenience not shown in the cross-sectional views of FIGS. 1a through 1d) in order to remove portions of PSG layer 106 where electrical contact is to be formed to source/drain region 105, diffusion of additional dopants, if desired, in the contact regions, and the formation of metal interconnects including metal in contact with the exposed portions of source/drain region 105. A metal alloy step is then performed at a relatively low temperature, followed by the deposition of a layer of oxide at low temperatures in order to cover the metallization layer.

If desired, the entire surface of the device is then covered with a layer of silicon nitride, and patterned to expose those portions to which external bonding wires are to be attached.

FIGS. 2a through 2d are a series of cross-sectional views depicting a prior art process for fabricating N channel MOS ROMs which are programmed by adjusting their threshold voltages utilizing an implant step. Thus, a transistor location is subjected to a threshold voltage adjustment implant when that cell location is to be programmed to a logical 1, and is not subjected to such a threshold voltage implant step when it is to remain unprogrammed in order to store a logical 0 state. With reference to FIGS. 2a through 2d, the right-hand side of the device shows the fabrication steps for forming a transistor 290 programmed to a logical 1 state by fabricating transistor 290 so that it has a threshold voltage which will cause that transistor to be turned on when it is read. The left-hand side of FIGS. 2a through 2d depict the formation of transistor 291 which is unprogrammed, i.e. stores a logical 0 state by having a threshold voltage such that transistor 291 does not turn on during the read operation.

In this prior art example, the starting material is a semiconductor substrate 100 of P-type material and <100>crystal orientation as depicted in FIG. 2a. A first process step is to form an initial oxide layer 101 on the active surface of substrate 100. On top of oxide layer 101 is formed nitride layer 102 which is followed by a photoresist mask (not shown) which is patterned to expose those portions of the silicon nitride layer 102 which are to be removed to define where field oxide is to be formed.

As shown in FIG. 2b, following removal of exposed portions of silicon nitride layer 102, field oxide 103 is formed where substrate 100 is not protected by silicon nitride 102. Nitride layer 102 and base oxide layer 101 are then removed and, as shown in FIG. 2c, a photoresist layer 108 is formed and patterned to expose those transistor cell locations which are to receive an implant in order to adjust their threshold voltage corresponding to the storage of a logical 1. The implant step is then performed, forming dope region 109 in to-be-formed logical 1 transistor 290, while not forming a corresponding doping area within to-be-formed logical 0 transistor 291. Photoresist layer 108 is then removed. As shown in FIG. 2d, base oxide layer 101 is removed and a new gate oxide formed. A layer of polycrystalline silicon is then formed over the top surface of the device and doped to a desired conductivity. Another layer of photoresist (not shown) is formed on the surface of the polycrystalline silicon layer and patterned to expose those portions of the layer of polycrystalline silicon which are to be removed in order to leave only gate electrodes 104 and any desired interconnects formed of polycrystalline silicon (not shown).

A source/drain implant is performed to form source/drain region 105 utilizing field oxide 103 and polycrystalline silicon 104 (or photoresist for CMOS processes) as source/drain implantation masks.

An additional photoresist mask is used to remove portions of source/drain oxide layer 112 in locations where a subsequent electrical interconnect layer is to contact one or more source/drain region 105, if desired. Then a layer of phosphosilicate glass (PSG) 106 is formed over the entire surface of the device, typically having a phosphorous concentration of approximately 8%. A gettering operation is performed at high temperature to allow PSG layer 106 to serve as a gettering source in order to trap undesired mobile ions such as sodium. Additional steps are then performed (although for convenience not shown in the cross-sectional views of FIGS. 1a through 1d) in order to remove portions of PSG layers 106 and 107 where electrical contact is to be formed to source/drain region 105, diffusion of additional dopants, if desired, in the contact regions, and the formation of metal interconnects including metal in contact with the exposed portions of source/drain region 105. A metal alloy step is then performed at a relatively low temperature, followed by the deposition of a layer of oxide at low temperatures in order to cover the metallization layer.

If desired, the entire surface of the device is then covered with a layer of silicon nitride, and patterned to expose those portions to which external bonding wires are to be attached.

It is also known in the prior art to fabricate CMOS ROMs which follow a similar process flow as depicted in FIGS. 1a–1d or 2a–2d, with the inclusion of additional steps in order to form the required P channel MOS devices. In a CMOS ROM, all memory cells are formed as either N channel or P channel memory cells (typically N channel) and thus the process flow depicted in FIGS. 1a–1d is illustrative for the purpose of showing a similar early mask programming of CMOS ROMs.

As can be seen from the above discussion of the prior art fabrication process depicted in FIGS. 1a through 1d, the programming of the various ROM memory transistors is performed quite early in the fabrication process, or as an implant step as depicted in FIGS. 2a–2d. In either of these prior art examples, the logical state of the ROM cells is determined very early in the fabrication process. As discussed above, this has serious disadvantages with respect to cost and turnaround time for relatively small quantities of ROMs programmed to a given ROM code.

It is known in the prior art to utilize a late mask programming of ROM memory cells, typically involving implantation following the metallization step. One example of a process used to fabricate such a post metal programming ROM device of the prior art is shown in the cross-sectional view of FIGS. 3a–3c. As shown in FIG. 3a, process steps have been completed to form P well 199 corresponding to the P type bulk provided by substrate 100 in the prior art process flow depicted in FIGS. 1a–1d, field oxide 203, source/drain regions 210 and 211, channel region 206, gate oxide 205, and polycrystalline silicon gate electrode 208. Also shown in the cross sectional view of FIGS. 3a–3c is a corresponding P channel device 280, when the ROM of FIGS. 3a and 3b is fabricated as part of a larger CMOS device. As shown in the cross-sectional view of FIG. 3a, metallization has been formed, including metallization interconnect 235 making contact with source/drain regions. In this prior art example, PSG layer 240 is formed before the formation and patterning of metallization interconnect layer 235, with PSG layer 240 having a phosphorous content of approximately 8%. As shown in FIG. 3b, PSG layer 240 is patterned to expose those memory transistors which are to receive a phosphorous implant for the purpose of adjusting the threshold voltage of their channel in order to change state of their data from a logical zero to a logical one. In other words, without the phosphorous implant to channel 206, the transistor would not properly function during the read operation, and, conversely, with the phosphorous added during this implant step to channel region 206, the memory transistor will be turned on and conduct during a read operation.

FIG. 3c is a cross sectional view of the post metal process, following the completion of certain additional processing steps. Thus, as shown in FIG. 3c, following the implantation step, a layer of 2.6% PSG is formed over the entire surface of the device and subsequently covered with silicon nitride layer 251. PSG layer 250 serves to minimize the stress from the top nitride, and has a phosphorous dopant concentration of only approximately 2.6% in order to provide a sufficiently low phosphorous dopant concentration to prevent undesired formation of phosphoric acid in the event of water penetration through pinholes in an overlying passivation layer.

Unfortunately, it has been found that not including the 8% PSG layer on the surface of gate electrode 208 as shown in the cross-sectional view of FIG. 3c fails to provide an appropriate gettering source for any mobile ions in that region of the device. It has been found that 2.6% PSG layer 250 above gate electrode 208 does not provide adequate gettering when a mobile ion contamination problem is present. In many instances, there is difficulty in providing adequate control of mobile ion contaminations in the various materials used during the fabrication of semiconductor devices, such as photoresist, photoresist strippers, and the like, meaning that in the prior art example shown in the cross sectional view of FIG. 3b, there will remain an undesirable presence of mobile ions at polycrystalline silicon gate electrode 208 which are not adequately gettered due to the lack of 8% PSG layer 240 above gate electrode 208. This results in failure of devices. Also, an extra process step is required to activate implanted phosphorus in channel 206. If the implanted phosphorous is not fully activated, there is a leakage problem. All late programmed ROM architectures require extra process steps to activate phosphorus implanted into the channels of programmed memory transistors, although it is common for such implanted phosphorous to not be fully activated, resulting in a certain level of undesired channel leakage.

Accordingly, it is desirable to have a fabrication process in which programming of ROM memory transistors can take place late during the fabrication process, and yet which provides adequate gettering over the entire surface of the semiconductor device, including over the channel regions to which dopants are to be implanted over to program the ROM code and in which full activation of implanted dopants is achieved without the need for an additional process step, and which full activation eliminates any leakage problems associated with unactivated programming dopants.

SUMMARY

In accordance with the invention, a novel process is taught for fabricating semiconductor devices including read only memory transistor cells. The memory cells are programmed to either a logical one or logical zero state by adjusting the dopant levels in their channel regions. In accordance with the teachings of this invention, a programming implantation step is selectively performed on those memory cell transistors which are to be programmed, with the programming implantation step being performed midway through the fabrication process. By performing this programming step midway through the process, it allows certain advantages to be obtained regarding improved turn around time from the receipt of a customer's order, as is the case with prior art late programming processes, and yet avoids the problems of incomplete activation of implanted dopants and ineffective gettering by the use of low dopant concentration gettering layers, as is common with post metallization programming processes.

BRIEF DESCRIPTION OF THE DRAWINGS

FIGS. 2a-2d are cross-sectional views depicting fabrication process of prior art implantation programming ROMs;

FIGS. 4a-4d are cross-sectional views depicting the fabrication of ROMs in accordance with one embodiment of the present invention.

DETAILED DESCRIPTION

Figure 1A:
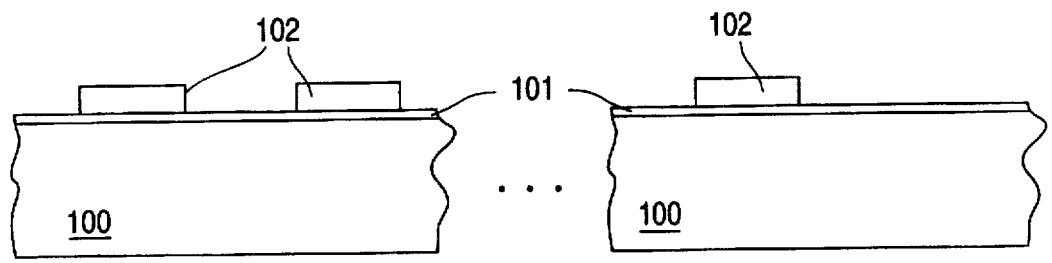
FIGS. 1a-1d are cross-sectional views depicting the process sequence of prior art diffusion implantation ROMs.
Figure 1B:
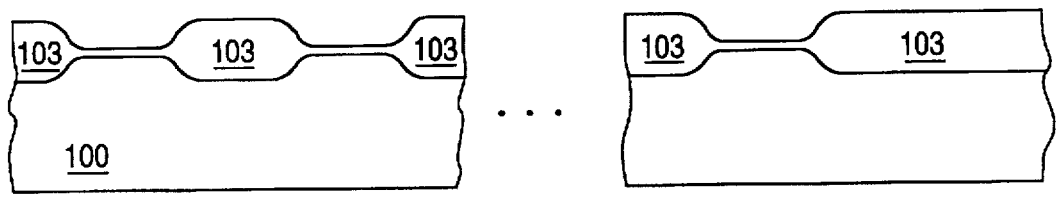
Figure 1C:
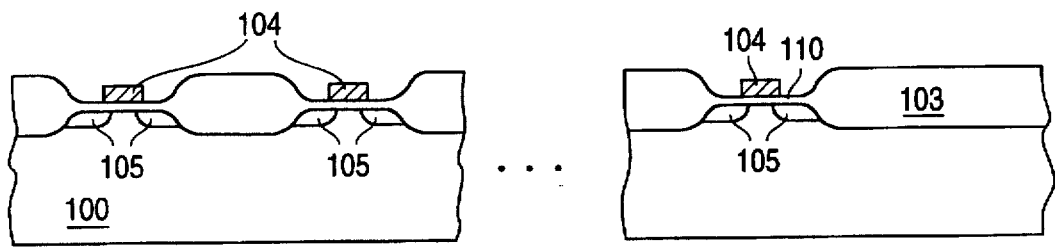
Figure 1D:
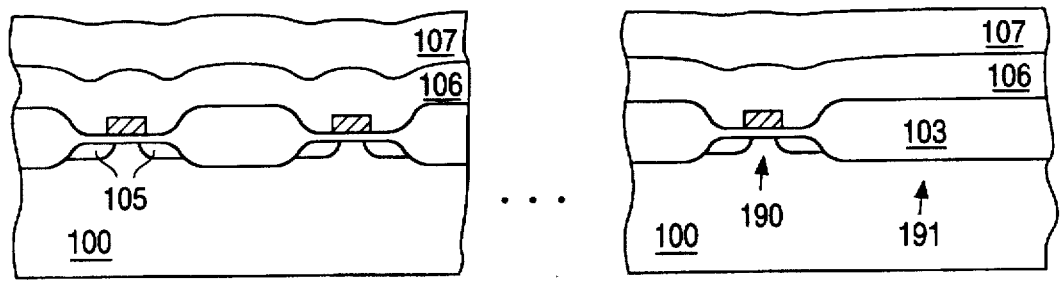
Figure 3A:
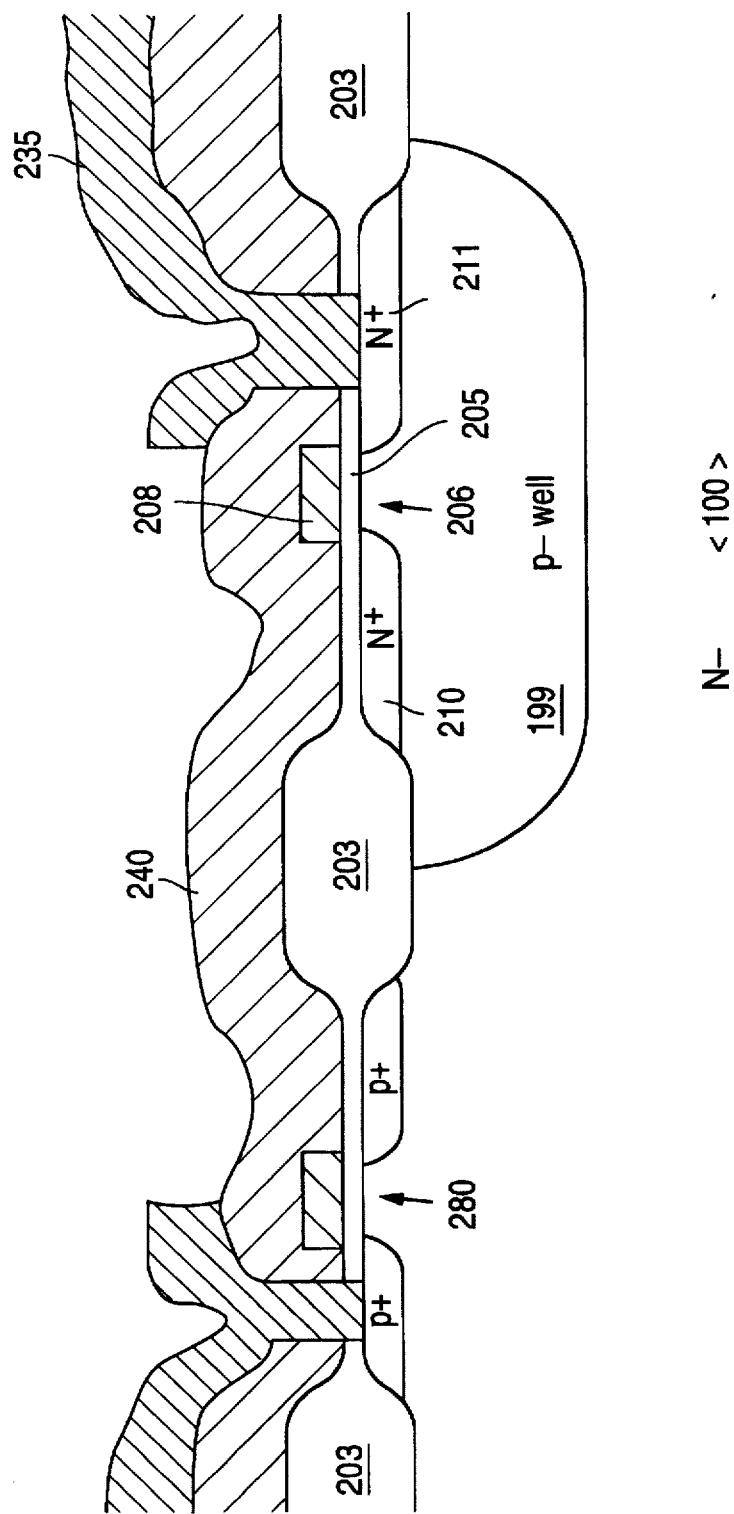
FIGS. 3a and 3c are cross-sectional views depicting the fabrication of prior art post metallization programmed ROMs.
Figure 3B:
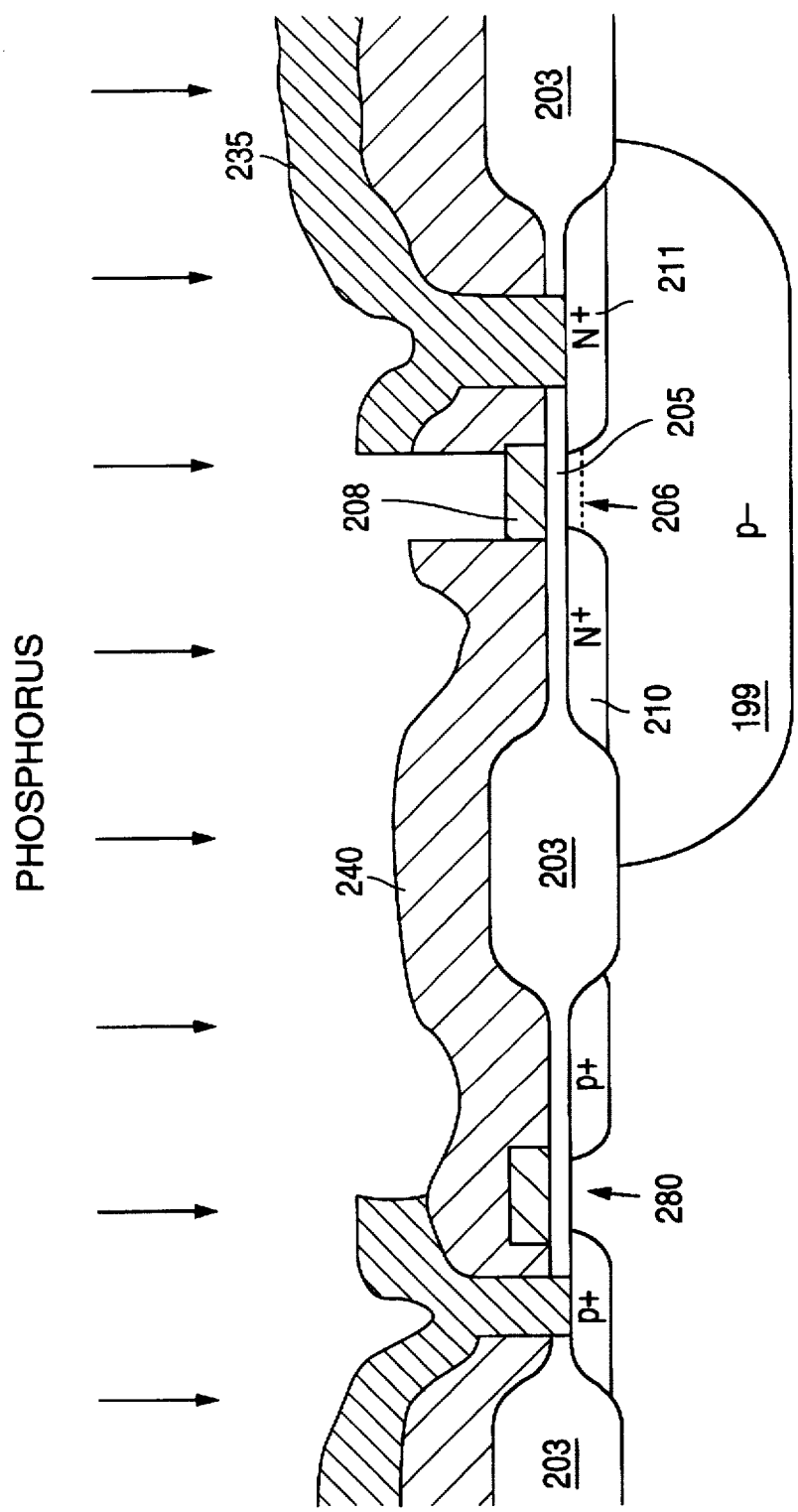
Figure 3C:
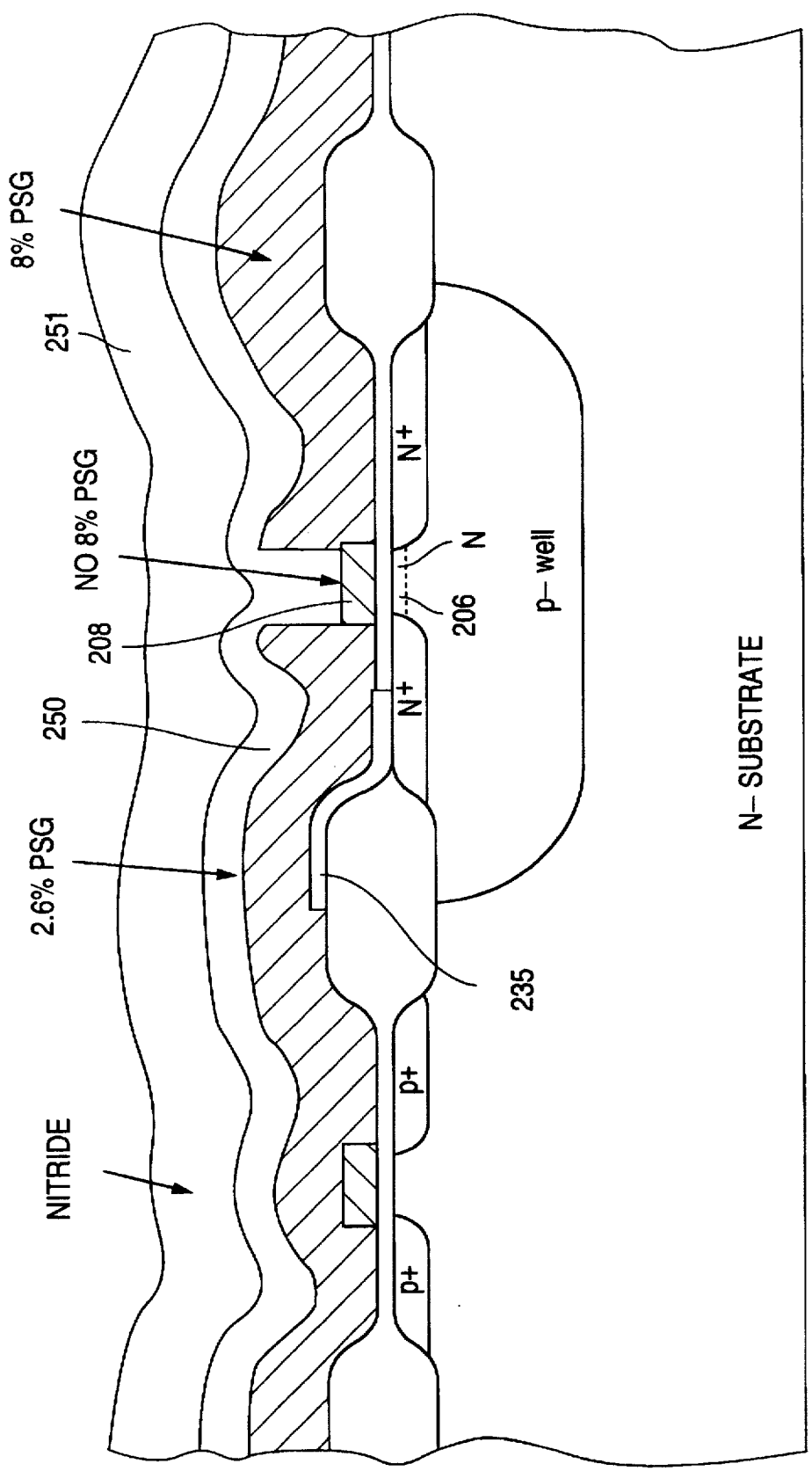

FIGS. 4a through 4d are cross-sectional views depicting one embodiment of a process in accordance with the teachings of this invention for fabricating a read only memory utilizing a program step midway through the fabrication process. Referring to FIGS. 4a through 4d, the right-hand side of the figure depicts the formation of a memory cell transistor 490 which is programmed by implantation of dopants to have a threshold voltage signifying the storage of a logical 1, thus meaning that transistor 490 will turn on during the read operation. The left-hand side of these figures depicts fabrication of a memory cell transistor 491 which does not receive this threshold voltage implantation, thereby having a higher threshold voltage such that transistor 491 will not turn on during a read operation, thus signifying that transistor 491 stores a logical 0.

Referring to FIG. 4a, substrate 100 is, for example, a silicon substrate of P-type material and <100>crystal orientation. Formed on the active surface of substrate 100 is initial oxide layer 101 formed to a thickness of approximately 500 Å, for example. On initial oxide layer 101 is formed a silicon nitride layer 102, which is followed by a photoresist mask (not shown) which is patterned to expose those portions of silicon nitride layer 102 which are to be removed to define where field oxide is to be formed.

As shown in FIG. 4b, a field oxidation step is performed forming field oxide 103 in areas of the device which are not protected by nitride mask 102. Field oxide 103 is formed, for example, to a thickness of approximately 10,000 Å. If desired, channel stopping dopants are implanted in the field region prior to the formation of field oxide 103.

Nitride layer 102 and initial oxide layer 101 are then removed and a gate oxide layer 110 is formed, for example to a thickness of approximately 500 Å. A layer of polycrystalline silicon is then formed over the surface of the device and patterned, for example by the use of suitable photoresist and etching techniques well known in the art, to form polycrystalline silicon gate electrodes 104 and any desired interconnects formed of polycrystalline silicon (not shown).

As shown in FIG. 4b, a source/drain implant is performed to form source/drain regions 105 utilizing field oxide 103 and polycrystalline silicon gate electrodes 104 as source/drain implantation masks. This source/drain implantation is performed, for example, using arsenic dopants at approximately 80 kev to a dosage of approximately $10^{15}$. This forms the source/drain regions of all memory cell transistors. An additional photoresist mask is used to remove portions of source/drain oxide layer 112 in locations where a subsequent electrical interconnect layer is to make electrical contact with such exposed source/drain regions 105, if desired.

As shown in FIG. 4c, a photoresist layer 108 is formed over the surface of the device and patterned to expose the channel region of to-be-formed transistor 490 which is to store a logical 1. An implantation step is then performed in order to implant dopants within channel region 109 of to-be-formed transistor 490. This implantation step is performed, for example, using phosphorus dopants implanted at approximately 240 kev to a dosage of approximately $10^{15}$, thereby lowering the threshold voltage of to-be-formed transistor 490. Photoresist layer 108 is then removed. Then a layer of phosphosilicate glass (PSG) or borophosphosilicate glass (BPSG) 106 is formed over the entire surface of the device, typically having a phosphorous concentration within the range of approximately 5 to 10%, for example approximately 8%. A getter operation at high temperature is performed 106 how PSG layer 106 to serve as a gettering source in order to trap undesired mobile ions such as sodium. This getter operation may serve, for example, to also reflow layer 106 and is performed at about 950° C. for PSG and about 800° C. for BPSG, and thus is sufficiently high temperature to activate the dopants selectively implanted into channel regions to program the memory transistors.

An additional layer of PSG 107 is then formed over the surface of the device, with PSG layer 107 having a doping concentration of approximately 3%, in order to minimize stress migrating from the to-be-formed top nitride layer, which will serve as a top passivation layer for the device. This is a sufficiently low phosphorous dopant concentration to prevent undesired formation of phosphoric acid should water penetrate through pinholes in an overlying passivation layer, which phosphoric acid is capable of damaging the device, such as by undesirable attacking aluminum metallization layers.

Thus, in accordance with the teachings of this invention, a novel process is taught for the fabrication of read only memories including memory cell transistors which receive a programming implantation midway through the fabrication process and prior to the fabrication of metallic interconnects and yet after fabrication of the polycrystalline silicon gate electrodes. This allows a greater flexibility in the inventorying of partially completed devices and a faster turn around time between receiving a customer's order with the customer's specific ROM pattern and the delivery of finished, programmed ROM devices to the customer. Furthermore, in accordance with the teachings of this invention, a process is taught in which an additional activation step is not required, as the process inherently includes process steps at sufficiently high temperature (e.g. about 800° C. or above) subsequent to the programming implantation to fully activate the implanted programming dopants. Such full activation of implanted programming dopants reduces leakage problems as compared with prior art post metal programming processes, in which programming dopant activation must take place at 450° C. or less, in order to prevent damage to the metal layer. Also, in accordance with the teachings of this invention, an adequate getter layer 106 of sufficient dopant concentration is provided, thereby providing higher yield and greater reliability as compared with prior art processes in which lower dopant dosages were used in the gettering layer.

Additional steps are then performed (although for convenience not shown in the cross-sectional views of FIGS. 4a through 4d) in order to remove portions of PSG layers 106 and 107 where electrical contact is to be formed to one or more source/drain regions 105, diffusion of additional dopants, if desired, in the contact regions, and the formation of metal interconnects including metal in contact with the exposed portions of source/drain region 105. A metal alloy step is then performed at a relatively low temperature, followed by the deposition of a layer of oxide at low temperatures to cover the metallization layer.

If desired, the entire surface of the device is then covered with a layer of silicon nitride and patterned to expose those portions to which external bonding wires are to be attached.

The invention now being fully described, it will be apparent to one of ordinary skill in the art that many changes and modifications can be made thereto without departing from the spirit or scope of the appended claims.

What is claimed is:

1. A method for fabricating a semiconductor device comprising the steps of:

defining active regions in a semiconductor substrate;

forming a patterned layer of conductive material on a surface of said substrate but separated from said surface by dielectric material, serving as gate electrodes of a plurality of transistors within said active regions;

forming source/drain regions within said active regions adjacent said gate electrodes, with portions of said active region beneath said gate electrodes serving as channel regions of said plurality of transistors;

implanting dopants into selected ones of said channel regions through associated gate electrodes to selectively program said plurality of transistors to a desired logical state;

after said step of implanting dopants, forming a gettering layer on substantially the entire surface of the structure thus formed;

gettering said structure at a sufficiently high temperature such that said gettering layer traps undesired mobile ions and substantially all of said dopants are activated;

forming a stress reduction layer on said gettering layer; and after said step of forming a stress reduction layer forming a layer of metalization on said stress reduction layer.

2. A method as in claim 1 wherein said step of defining active areas comprises the step of forming field isolation regions in areas other than said active areas.

3. A method as in claim 1 wherein said step of forming a patterned conductive layer comprises the step of forming a patterned layer of polycrystalline silicon.

4. A method as in claim 1 wherein said step of forming a patterned conductive layer comprises the step of forming gate electrodes and electrical interconnects.

5. A method as in claim 1 wherein said temperature sufficiently high is approximately 800° C. or higher.

6. A method for fabricating a semiconductor device comprising the steps of:

defining active regions in a semiconductor substrate;

forming a patterned layer of conductive material on a surface of said substrate but separated from said surface by dielectric material, serving as gate electrodes of a plurality of transistors within said active regions;

forming source/drain regions within said active regions adjacent said gate electrodes, with portions of said active region beneath said gate electrodes serving as channel regions of said plurality of transistors;

implanting dopants into selected ones of said channel regions through associated gate electrodes to selectively program said plurality of transistors to a desired logical state;

after said step of implanting dopants, forming a gettering layer on substantially the entire surface of the structure thus formed; and gettering said structure at a sufficiently high temperature such that said gettering layer traps undesired mobile ions and substantially all of said dopants are activated prior to metalization.

7. A method as in claim 6 wherein said step of defining active areas comprises the step of forming field isolation regions in areas other than said active areas.

8. A method as in claim 6 wherein said step of forming a patterned conductive layer comprises the step of forming a patterned layer of polycrystalline silicon.

9. A method as in claim 6 wherein said step of forming a patterned conductive layer comprises the step of forming gate electrodes and electrical interconnects.

10. A method as in claim 6 wherein said step of implanting dopants is followed by at least one additional process step performed at a temperature sufficiently high to activate said programming dopants.

11. A method as in claim 10 wherein said temperature sufficiently high is approximately 800° C. or higher.

12. A method as in claim 10 wherein said at least one additional process step comprises a reflow step.

13. A method for fabricating a semiconductor device comprising the steps of:

defining active regions in a semiconductor substrate;

forming a patterned layer of conductive material on a surface of said substrate but separated from said surface by dielectric material, serving as gate electrodes of a plurality of transistors within said active regions;

forming source/drain regions within said active regions adjacent said gate electrodes, with portions of said active region beneath said gate electrodes serving as channel regions of said plurality of transistors;

implanting dopants into selected ones of said channel regions through associated gate electrodes to selectively program said plurality of transistors to a desired logical state;

after said step of implanting dopants, activating said dopants by processing said device at a sufficiently high temperature to activate substantially all of said dopants prior to metalization;

after said step of implanting dopants, forming a gettering layer on substantially the entire surface of the structure thus formed;

gettering said structure by reflowing said gettering layer such that said gettering layer traps undesired mobile ions;

forming a stress reduction layer on said gettering layer; and after said step of forming a stress reduction layer forming a layer of metalization on said stress reduction layer.

14. A method for fabricating a semiconductor device comprising the steps of:

defining active regions in a semiconductor substrate;

forming a patterned layer of conductive material on a surface of said substrate but separated from said surface by dielectric material, serving as gate electrodes of a plurality of transistors within said active regions;

forming source/drain regions within said active regions adjacent said gate electrodes, with portions of said active region beneath said gate electrodes serving as channel regions of said plurality of transistors;

implanting dopants into selected ones of said channel regions through associated gate electrodes to selectively program said plurality of transistors to a desired logical state;

after said step of implanting dopants, performing at least one additional process step performed at a temperature sufficiently high to activate substantially all of said programming dopants;

after said step of implanting dopants, forming a gettering layer on substantially the entire surface of the structure thus formed;

gettering said structure such that said gettering layer traps undesired mobile ions;

forming a stress reduction layer on said gettering layer; and after said step of forming a stress reduction layer, forming a layer of metalization on said stress reduction layer.

15. A method as in claim 14 wherein said temperature sufficiently high is approximately 800° C. or higher.

16. A method as in claim 14 wherein said at least one additional process step comprises a reflow step.

17. A method as in claim 14 wherein said at least one additional process step is performed prior to said step of forming a layer of metalization.

18. A method of fabricating a semiconductor device comprising the steps of:

defining active regions in a semiconductor substrate;

forming a patterned layer of conductive material overlying a surface of said substrate but separated from said surface by dielectric material, said patterned layer serving as gate electrodes of a plurality of transistors within said active regions;

forming source/drain regions within said active regions adjacent said gate electrodes with portions of said active regions beneath said gate electrodes serving as channel regions of said plurality of transistors;

implanting dopants into selected ones of said channel regions through associated gate electrodes to selectively program said plurality of transistors to a desired logical state;

after said step of implanting dopants, forming a phosphosilicate glass (PSG) gettering layer on substantially the entire surface of the structure thus formed, the PSG gettering layer having a dopant concentration within the range of 5–10%;

gettering said structure at a sufficiently high temperature such that said PSG gettering layer traps undesired mobile ions and substantially all of said dopants are activated;

forming a PSG stress reduction layer on said PSG gettering layer, the PSG stress reduction layer having a dopant concentration of approximately 3%; and after said step of forming a PSG stress reduction layer, forming a metallization layer on said PSG stress reduction layer.

19. A method of fabricating a semiconductor device comprising the steps of:

defining active regions in a semiconductor substrate;

forming a patterned layer of conductive material overlying a surface of said substrate but separated from said surface by dielectric material, said patterned layer serving as gate electrodes of a plurality of transistors within said active regions;

forming source/drain regions within said active regions adjacent said gate electrodes, with portions of said active regions beneath said gate electrodes serving as channel regions of said plurality of transistors;

implanting dopants into selected ones of said channel regions through associated gate electrodes to selectively program said plurality of transistors to a desired logic state;

after said step of implanting dopants, forming a phosphosilicate glass (PSG) gettering layer of substantially the entire surface of the structure thus formed, the PSG gettering layer having a dopant concentration within the range of approximately 5–10%; and gettering said structure at a sufficiently high temperature such that said gettering layer traps undesired mobile ions and substantially all of said dopants are activated.

* * * * *